US011625521B2

(12) United States Patent
Lu

(10) Patent No.: US 11,625,521 B2
(45) Date of Patent: Apr. 11, 2023

(54) METHOD, EMULATOR, AND STORAGE MEDIA FOR DEBUGGING LOGIC SYSTEM DESIGN

(71) Applicant: XEPIC CORPORATION LIMITED, Nanjing (CN)

(72) Inventor: Yan Lu, Shanghai (CN)

(73) Assignee: XEPIC CORPORATION LIMITED, Nanjing (CN)

( * ) Notice: Subject to any disclaimer, the term of this patent is extended or adjusted under 35 U.S.C. 154(b) by 44 days.

(21) Appl. No.: 17/465,167

(22) Filed: Sep. 2, 2021

(65) Prior Publication Data

US 2022/0114312 A1 Apr. 14, 2022

(30) Foreign Application Priority Data

Oct. 9, 2020 (CN) .......................... 202011068776.9

(51) Int. Cl.
    *G06F 30/327* (2020.01)
    *G06F 30/333* (2020.01)
    *G06F 30/3308* (2020.01)
    *G06F 30/367* (2020.01)
    *G06F 30/398* (2020.01)
    *G06F 11/00* (2006.01)
    *G06F 11/36* (2006.01)

(52) U.S. Cl.
    CPC ........ *G06F 30/327* (2020.01); *G06F 11/3652* (2013.01); *G06F 30/333* (2020.01); *G06F 30/3308* (2020.01); *G06F 30/367* (2020.01); *G06F 30/398* (2020.01)

(58) Field of Classification Search
CPC .. G06F 30/327; G06F 30/333; G06F 30/3308; G06F 30/367; G06F 30/398; G06F 11/3652
USPC ............ 716/104, 106, 111, 136; 703/15, 16; 714/33, 732, 741
See application file for complete search history.

(56) References Cited

U.S. PATENT DOCUMENTS

| | | | | |
|---|---|---|---|---|
| 7,117,458 B1 * | 10/2006 | Hurlock | .................. | G06F 30/33 703/13 |
| 9,026,966 B1 * | 5/2015 | Ramachandran | ....... | G06F 30/33 716/108 |
| 9,934,342 B1 * | 4/2018 | Huang | ................ | G06F 30/3323 |
| 10,664,637 B2 * | 5/2020 | Krishnamurthy | ..... | G06F 30/331 |
| 11,216,606 B1 * | 1/2022 | Turbovich | .......... | G06F 30/3308 |

(Continued)

FOREIGN PATENT DOCUMENTS

| | | | |
|---|---|---|---|
| CN | 104598659 A | | 5/2015 |
| CN | 110308381 A | | 10/2019 |

(Continued)

*Primary Examiner* — Phallaka Kik
(74) *Attorney, Agent, or Firm* — Anova Law Group, PLLC

(57) ABSTRACT

A method for debugging a logic system design including a target module to be debugged. The method includes receiving a first gate-level netlist associated with the logic system design and a second gate-level netlist associated with the target module that are generated based on a description of the logic system design, obtaining runtime information of an input signal of the target module by running the first gate-level netlist, and obtaining runtime information of the target module by running the second gate-level netlist based on the runtime information of the input signal of the target module.

20 Claims, 7 Drawing Sheets

(56) References Cited

U.S. PATENT DOCUMENTS

| | | | |
|---|---|---|---|
| 2010/0169856 A1* | 7/2010 | Hom | G01R 31/318583 714/E11.155 |
| 2010/0217564 A1* | 8/2010 | Lahner | G06F 30/3312 703/1 |
| 2014/0047400 A1* | 2/2014 | Miyake | G06F 30/327 716/104 |
| 2014/0089872 A1* | 3/2014 | Galpin | G06F 30/33 716/102 |
| 2014/0282338 A1* | 9/2014 | Nayak | G06F 30/394 716/120 |
| 2014/0331196 A1* | 11/2014 | Helvey | G06F 30/394 716/113 |
| 2015/0040087 A1* | 2/2015 | Lin | G06F 30/33 716/109 |
| 2015/0120268 A1* | 4/2015 | Dai | G06F 30/3312 703/14 |
| 2016/0328499 A1* | 11/2016 | Larzul | G06F 30/34 |
| 2017/0011139 A1* | 1/2017 | Arts | G06F 30/327 |
| 2017/0185710 A1* | 6/2017 | Suresh | G06F 30/331 |
| 2020/0242006 A1* | 7/2020 | Lin | G06F 11/3652 |
| 2021/0026994 A1* | 1/2021 | Tehranipoor | G06F 30/343 |
| 2021/0056175 A1* | 2/2021 | Chiang | G06F 30/327 |
| 2022/0261522 A1* | 8/2022 | Cook | G06F 30/327 |

FOREIGN PATENT DOCUMENTS

| | | | |
|---|---|---|---|
| EP | 1696328 A2 | | 8/2006 |
| JP | 2002328964 A | * | 11/2002 |
| JP | 2003085221 A | * | 3/2003 |
| JP | 2019133591 A | * | 8/2019 |

* cited by examiner

METHOD, EMULATOR, AND STORAGE MEDIA FOR DEBUGGING LOGIC SYSTEM DESIGN

CROSS REFERENCE TO RELATED APPLICATION

This application claims the benefits of priority of Chinese Application No. 202011068776.9, filed Oct. 9, 2020, which is incorporated herein by reference in its entirety.

TECHNICAL FIELD

This disclosure is related to an area of circuit technology, more particularly to methods, devices, and storage medium for debugging a logic system design.

BACKGROUND

An emulator can prototype and debug a logic system design including one or more modules. The logic system design can be, for example, an application specific integrated circuit (ASIC), a System-on-Chip (SOC) design, or the like. Therefore, the logic system design being tested in the emulator can also be referred to as a Design Under Test (DUT). An emulator can emulate the DUT using one or more configurable component (for example, field programmable gate array (FPGA)), the emulation includes a variety of operations of the DUT. Therefore, functions of various modules of the DUT can be tested and verified before being manufactured.

To implement the verification of a module of a DUT, signal probing needs to be performed on the module. However, because the logic units and layout resources are limited in an emulator and the signal probing requires an extended number of logic units and layout resources, the emulation of a complicated DUT can take very long or fail because of insufficient resources of the emulator.

SUMMARY

In view of the above problems, the disclosure provides methods, devices, and storage medium for debugging a logic system design.

A first aspect of the disclosure provides a method for debugging a logic system design, wherein the logic system design includes a target module to be debugged. The method comprises: receiving a first gate-level netlist associated with the logic system design and a second gate-level netlist associated with the target module, wherein the first gate-level netlist and the second gate-level netlist are generated based on the description of the logic system design; obtaining runtime information of an input signal of the target module by running the first gate-level netlist; obtaining runtime information of the target module by running the second gate-level netlist based on the runtime information of the input signal of the target module.

A second aspect of the disclosure provides an emulator for debugging a logic system design, wherein the logic system design includes a target module to be debugged. The emulator comprises: an interface unit for connecting with a host; a memory for storing a set of instructions; at least one processor, configured to execute the set of instructions to perform the method described in the first aspect.

A third aspect of the disclosure provides a non-transitory computer-readable storage medium, wherein the non-transitory computer-readable storage medium can store a set of instructions of the electronic device, wherein the set of instructions is used to make the electronic device perform the method described in the first aspect.

BRIEF DESCRIPTION OF THE DRAWINGS

To describe the technical solutions in the present disclosure more clearly, the following will briefly introduce the figures that need to be used in the embodiments. Obviously, the figures in the following description are merely exemplary, for those ordinary skilled in the art, without creative work, other figures can be obtained based on these figures.

DETAILED DESCRIPTION

To make the objectives, technical solutions, and advantages of the disclosure clearer, the following description of the disclosure will be made in association with embodiments and drawings.

It should be noted that, unless otherwise defined, the technical terms or scientific terms used in the disclosure shall have the usual meanings understood by those ordinary skilled in the art to which this disclosure belongs. Phrases such as "first" or "second" used in the disclosure do not indicate any order, quantity, or importance, but are only used to distinguish different components. Phrase such as "include" or "comprise" mean that the element or item appearing before the word covers the element or item listed after the word and its equivalents, but does not exclude other elements or items. Phrases such as "connection" or "connected" are not limited to physical or mechanical connections, but may include electrical connections, whether direct or indirect. Under normal circumstances, "one" and "a" can be understood as one or more instead of a limited number.

As discussed above, the emulation of a complicated DUT can take very long or fail because of insufficient resources of an emulator. This problem has been more serious recently with the increased size and complicity of an integrated circuit design.

The disclosure provides methods and devices for debugging a logic system design. According to the disclosure, a first gate-level netlist associated with the logic system design and a second gate-level netlist associated with a target module are received, wherein the first gate-level netlist and the second gate-level netlist are generated based on the description of the logic system design; runtime information of an input signal of the target module is obtained by running the first gate-level netlist; runtime information of the target module is obtained by running the second gate-level netlist based on the runtime information of the input signal of the target module. Because what is obtained by running the first gate-level netlist is the input signal of the target module, the number of signals to be probed can be reduced to make wiring and emulation faster. Furthermore, while the second gate-level netlist is being run, because the second gate-level netlist corresponding to the target module can reduce the emulation complexity and release the wiring resources, the wiring and emulation time required for the second gate-level netlist can also be decreased. In this way, under the premise of obtaining the complete runtime information of the target module, the methods and devices provided by the disclosure can reduce the consumption of emulator's resources and reduce the emulation and debugging time of complex designs.

Figure 1:
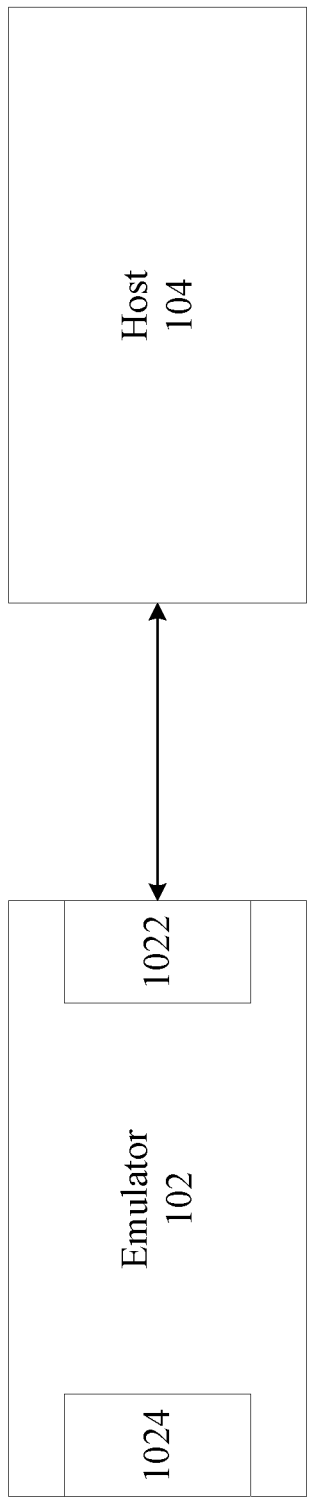
FIG. 1 illustrates a schematic structural diagram of an exemplary emulation system, according to embodiments of the present disclosure.

FIG. 1 illustrates a schematic structural diagram of an exemplary emulation system, according to embodiments of the present disclosure.

As shown in FIG. 1, an emulation system 100 can include an emulator 102 and a host 104.

Emulator 102 is a hardware system for emulating a design under test (DUT). The DUT can include a plurality of modules. The DUT can be a combinational logic (CL) circuit, a sequential logic circuit, or a combination of both. Emulator 102 can include one or more configurable circuits (e.g., FPGA) for emulating the DUT.

Emulator 102 can include an interface unit 1022, communicatively coupled with host 104 for communication between host 104 and emulator 102. In some embodiments, interface unit 1022 can include one or more interfaces with electrical connection capabilities. For instance, interface unit 1022 can include a RS232 interface, a USB interface, a LAN interface, an optical fiber interface, an IEEE1394 (Firewire interface), or the like. In some embodiments, interface unit 1022 can be a wireless network interface. For instance, interface unit 1022 may be a WIFI interface, a Bluetooth interface, and the like.

Emulator 102 can also include a memory 1024 for storing signal values generated by the DUT during the emulation process. In some embodiments, the signal values generated by the DUT during the emulation process can be directly read by host 104.

Host 104 can configure emulator 102 to emulate a DUT. The DUT can be a complete logic system design or one or more target modules of the complete logic system design. In some embodiments, host 104 can be a virtual host in a cloud computing system. The logic system design (e.g., ASIC or System-On-Chip) can be designed by a hardware description language (e.g., Verilog, VHDL, System C, or System Verilog). In some embodiments, the logic system design can include one or more target modules to be debugged.

Host 104 can receive a request from a user to debug the DUT. As mentioned above, the DUT can include one or more modules. The DUT and its modules can be described by a hardware description language. Host 104 can generate, for example, a gate-level netlist of the DUT based on the description of the DUT and its modules.

Conventionally, complete signal probing is directly performed on the DUT. Due to the limited logic units and wiring resources of the configurable circuit (e.g., FPGA) for emulating the DUT, the emulation and verification of a complex logic system design can cost too much emulation time or fail due to insufficient resources.

Figure 2A:
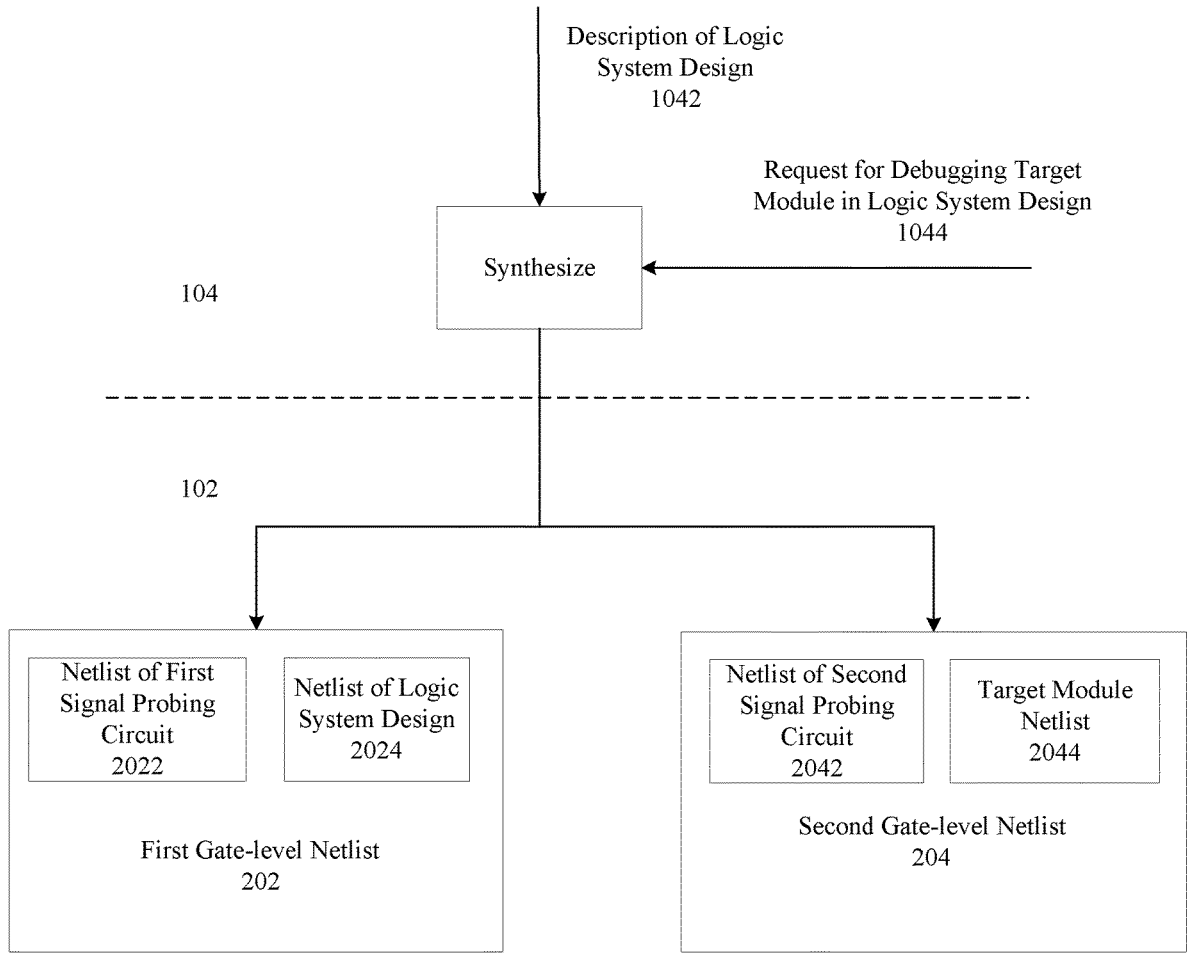
FIG. 2A illustrates a schematic diagram of an exemplary process of generating a netlist, according to embodiments of the present disclosure.

FIG. 2A illustrates a schematic diagram of an exemplary process 200 of generating a netlist, according to embodiments of the present disclosure.

In some embodiments, as shown in FIG. 2A, host 104 can receive a description 1042 of the logic system design and a request 1044 from a target module of the logic system design. As mentioned above, description 1042 of the logic system design can be in a hardware description language. Request 1044 can be a request sent by the user operating host 104 for debugging the target module in the logic system design. It is appreciated that, in some embodiments, a user can send a request for debugging a plurality of target modules at one time, and host 104 can generate a plurality of requests for respectively debugging the target modules according to the request for debugging the plurality of target modules. All these requests can be executed sequentially or in parallel.

According to request 1044, host 104 can generate a first gate-level netlist 202 and a second gate-level netlist 204 according to description 1042 of the logic system design. For example, the compiler of the hardware description language running on host 104 can be used to synthesize description 1042 of the logic system design, and then generate the corresponding gate-level netlists.

Therefore, gate-level netlists (e.g., first gate-level netlist 202 and second gate-level netlist 204), which describe the circuit structure and connection relationship of circuits, can also be referred to as a synthesized design. The configurable circuit (e.g., FPGA) for emulating the DUT can run the circuits after loading the gate-level netlists. First gate-level netlist 202 can be associated with the logic system design. That is, first gate-level netlist 202 describes the circuit structure of the logic system design. Second gate-level netlist 204 can be associated with the target module. That is, second gate-level netlist 204 describes the circuit structure of the target module.

First gate-level netlist 202 and second gate-level netlist 204, which are generated by synthesizing, can be received by emulator 102 via interface unit 1022.

By emulating a DUT (e.g., a complete logic system design or one target module of the logic system design) according to a gate-level netlist in a configurable circuit, emulator 102 can obtain the runtime information of various signals of the logic system design. The runtime information can be signal values of an input signal or an output signal of the gate-level circuit of the DUT at at least one moment. The runtime information can include signal values of an input signal or an output signal during the entire runtime or part thereof. The runtime information can be expressed in a form of, for example, waveforms, data tables, discrete plane coordinate points, and the like.

Emulator 102 can run first gate-level netlist 202 to obtain the runtime information of the input signals of the target module. As shown in FIG. 2A, first gate-level netlist 202 can include a netlist 2022 of first signal probing circuit and a netlist 2024 of the logic system design. The first signal probing circuit can be used to probe the runtime information of the input signals of the target module.

Figure 2B:
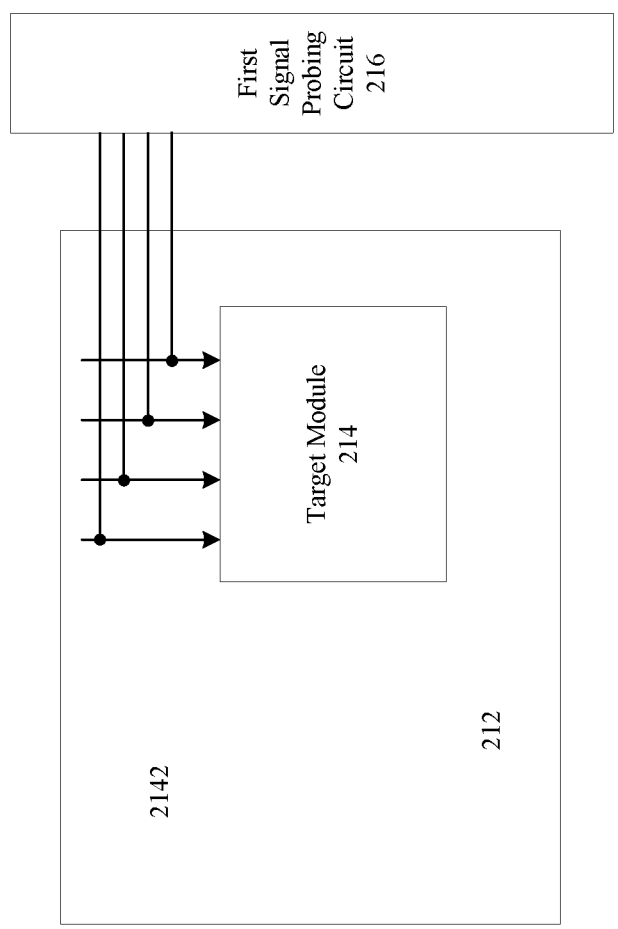
FIG. 2B illustrates a schematic structural diagram of an emulation circuit corresponding to a first gate-level netlist, according to embodiments of the present disclosure.

FIG. 2B illustrates a schematic structural diagram of an emulation circuit 210 corresponding to first gate-level netlist 202, according to embodiments of the present disclosure. In some embodiments, emulator 102 can load first gate-level netlist 202 into a configurable circuit (e.g., FPGA) for running, and therefore, emulation circuits (e.g., emulation circuit 210 as shown in FIG. 2B) can be formed in the configurable circuit.

Because first gate-level netlist 202 includes the entire netlists 2024 of the logic system design, emulation circuit 210 corresponding to first gate-level netlist 202 can include logic system design 212. Runtime information of the complete logic system design, including the runtime information of the target module, can be generated by running logic system design 212. As shown in FIG. 2B, emulation circuit 210 can further include a target module 214 and a first signal probing circuit 216. Because emulation circuit 210 includes logic system design 212 and target module 214 and can generate the complete runtime information of the logic system design, emulator 102 can generate input signals 2142 of target module 214 by running emulation circuit 210 corresponding to first gate-level netlist 202. Input signals 2142 can be probed.

First signal probing circuit 216 can be configured to probe the runtime information of input signals 2142 of target module 214 while logic system design 212 is being run. The runtime information of input signals 2142 of target module 214 can be saved to a memory 1024 in emulator 102 or saved to host 104 via interface unit 1022. Because first signal probing circuit 216 is configured to probe the runtime information of input signals 2142 of target module 214, compared to probing the entire runtime information of logic system design 212, the runtime information of input signals 2142 of target module 214 does not occupy too much wiring resources of emulator 102.

Based on the runtime information of input signals of the target module, emulator 102 can further run second gate-level netlist 204 to obtain the runtime information of target module 214. By running second gate-level netlist 204, emulator 102 can generate an emulation circuit corresponding to second gate-level netlist 204.

Figure 2C:
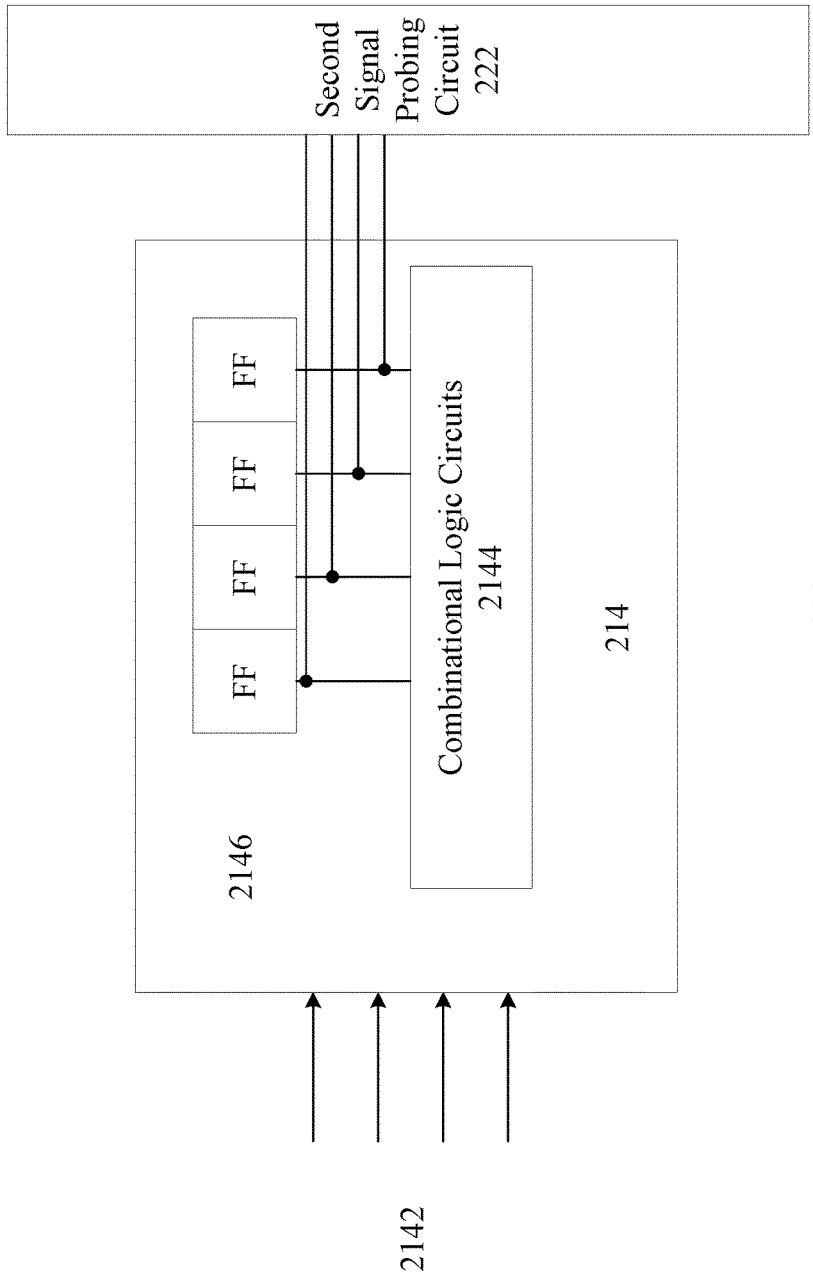
FIG. 2C illustrates a schematic structural diagram of an emulation circuit corresponding to a second gate-level netlist, according to embodiments of the present disclosure.

FIG. 2C illustrates a schematic structural diagram of an emulation circuit 220 corresponding to second gate-level netlist 204, according to embodiments of the present disclosure.

Because second gate-level netlist 204 includes target module netlist 2044 and netlist 2042 of second signal probing circuit (as shown in FIG. 2A), running emulation circuit 220 corresponding to second gate-level netlist 204 can generate the runtime information of the target module, which can be probed by the second signal probing circuit. As shown in FIG. 2C, emulation circuit 220 corresponding to second gate-level netlist 204 can include target module 214 and a second signal probing circuit 222. Target model 214 can further include a plurality of combinational logic (CL) circuits 2144 and sequential logic circuits 2146. In FIG. 2C, flip-flop (FF) can be used to represent sequential logic circuits. It is appreciated that, sequential logic circuits are not limited to flip-flops. Because the input signals (e.g., input signal 2142 as shown in FIG. 2B) of target module 214 have been obtained by running first gate-level netlist 202, emulation circuit 220 of the second gate-level netlist can use input signals 2142 as stimulus signals on target module 214 and obtain the runtime information of target module 214 based on input signals 2142.

As shown in FIG. 2C, a second signal probing circuit 222 can at least probe the runtime information of output signals of the plurality of sequential logic circuits 2146. With respect to the plurality of combinational logic circuits 2144 of target model 214, the stimulus signals thereof can include output signals of sequential logic circuits 2146 and input signals 2142 of target module 214. In some embodiments, the stimulus signals can include at least one of the output signals of the internal memory (not shown) of target module 214.

Because the internal circuit structure of the target module 214 is known (e.g., obtained by second gate-level netlist 204), the runtime information of the output signals of combinational logic circuits 2144 of target module 214 can be at least generated by the runtime information of input signals 2142 of target module 214 and the runtime information of the output signals of the plurality of sequential logic circuits 2146. In some embodiments, the runtime information of combinational logic circuits 2144 of target module 214 can be generated according to the runtime information of input signals 2142 of target module 214, the runtime information of the output signals of plurality of sequential logic circuits 2146 of target module 214 and the runtime information of the output signals of internal memory of target module 214.

Figure 3A:
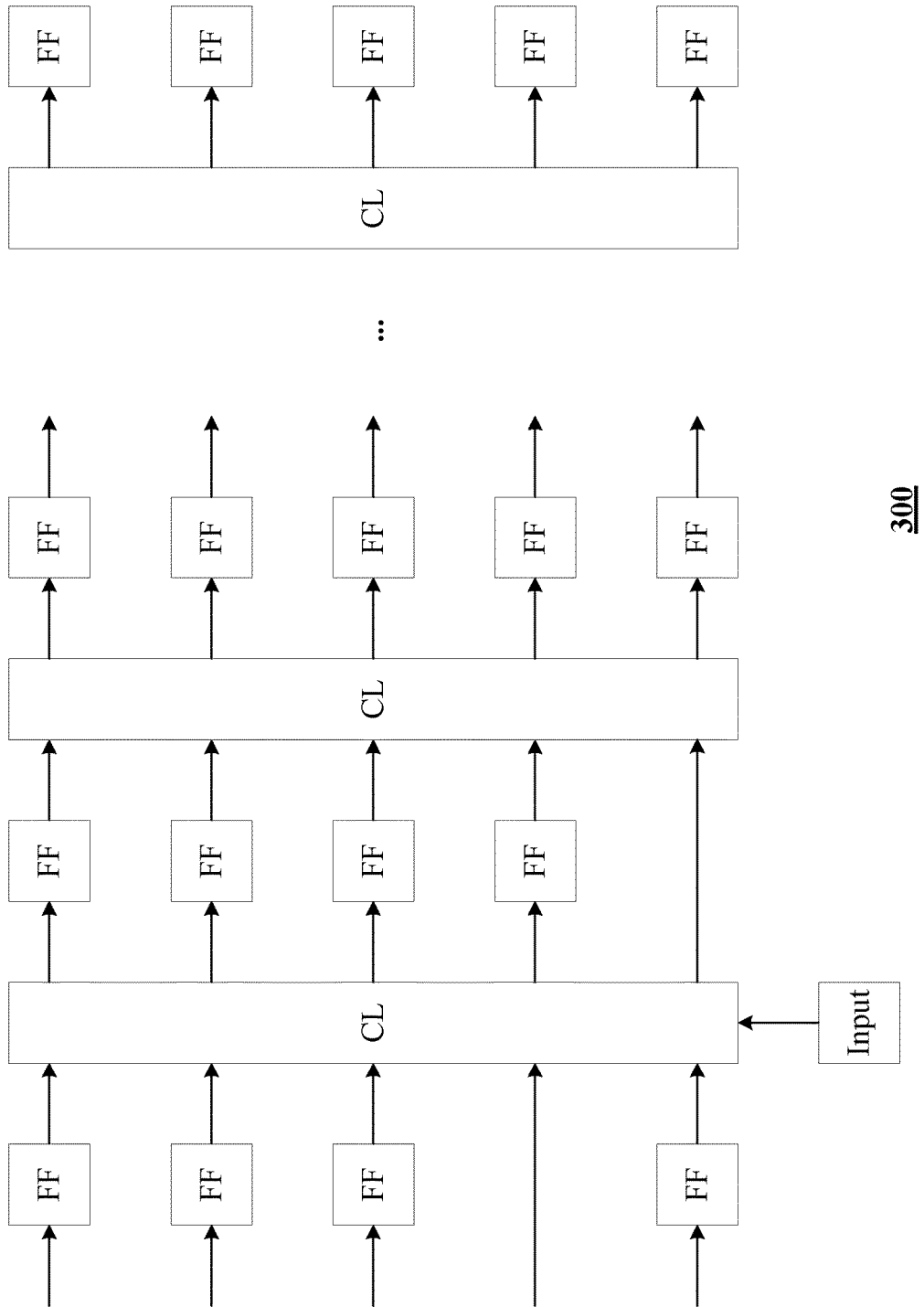
FIG. 3A illustrates an exemplary circuit structure diagram, according to embodiments of the present disclosure.

FIG. 3A illustrates an exemplary circuit structure 300 according to embodiments of the present disclosure. As shown in FIG. 3A, the circuit structure can include a plurality of flip-flops (FF) and a plurality of combinational logic circuit (CL) components. It is appreciated that, a combinational logic circuit component can include at least one combinational logic circuit. In addition to output signals of flip-flops, input signals of a combinational logic circuit component can further include the input signals of the target module thereof and output signals of other combinational logic circuit components.

Figure 3B:
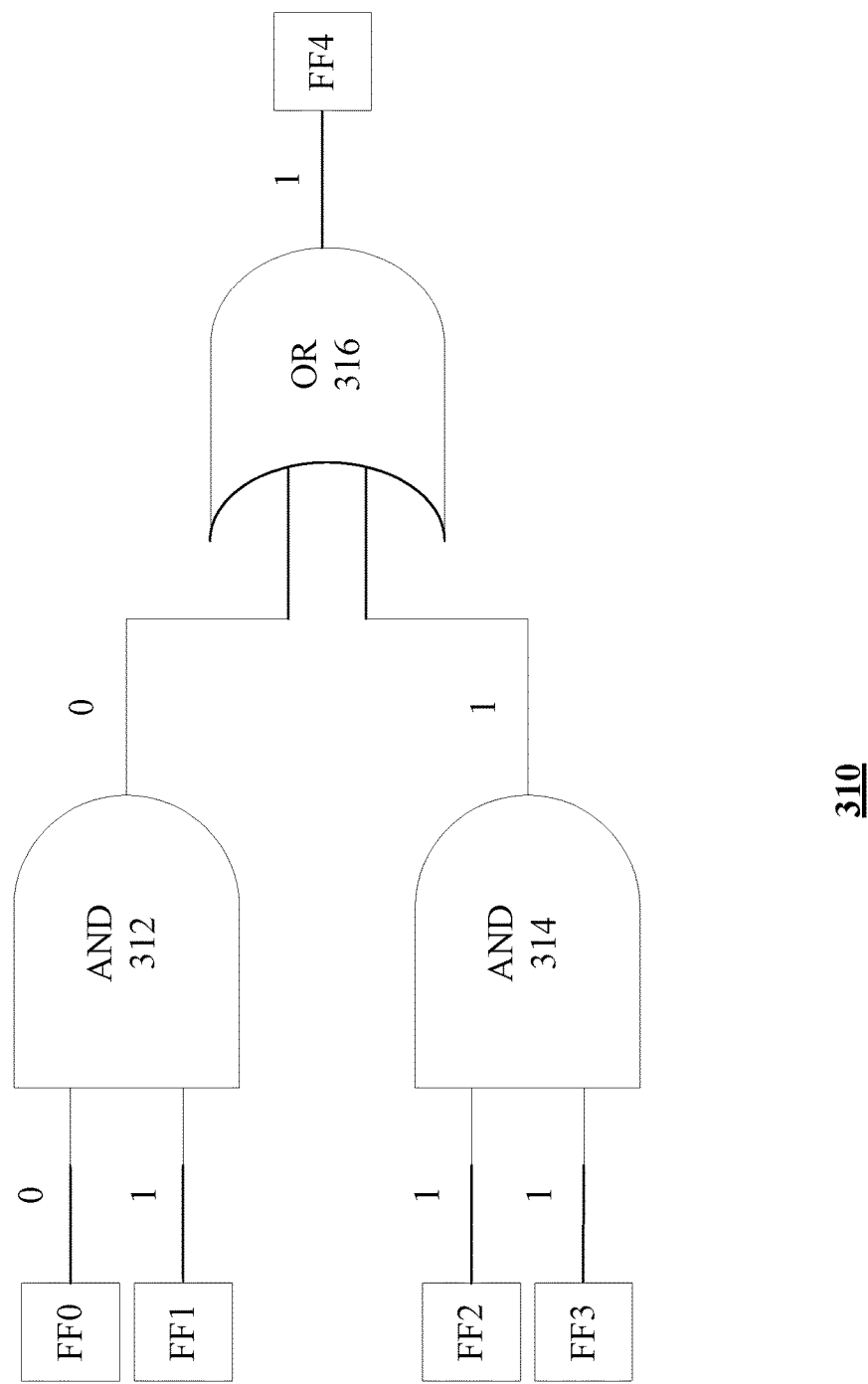
FIG. 3B illustrates another exemplary circuit structure diagram, according to embodiments of the present disclosure.

FIG. 3B illustrates another exemplary circuit structure 310 according to the embodiments of the present disclosure. It is appreciated that, circuit structure 300 or circuit structure 310 can be obtained by the description of the circuit structure.

As shown in FIG. 3B, assuming that the delay of each gate-level circuit is "delay," output signal values from FF0 to FF3 at moment T0 are "0," "1," "1," and "1," respectively, and input signal value of FF4 at moment T0+delay*2 is "1." Based on the runtime information (e.g., signal value at moment T0) of the output signals from FF0 to FF4 and the circuit structure of the known target module, it can be determined that the input of an AND-gate 312 at moment T0 is "01" and the output thereof at moment T0+delay is "0," the input of an AND-gate 314 at moment T0 is "11" and the output thereof at moment T0+delay is "1," the input of an OR-gate 316 at moment T0+delay is "01" and the output thereof at moment T0+delay*2 is "1." Because the output of OR-gate 316 is the output of FF4 at next moment, the runtime information of the output signals of FF4 can be calculated by the runtime information of the output signals from FF0 to FF3.

As shown in FIG. 2C, output signals of FF4 can be probed by second signal probing circuit 222. Therefore, circuit structure 310 can be self-verified by comparing the calculated output signals of FF4 and the probed output signals of FF4.

Similarly, the runtime information of all signals of combinational logic circuits of a target module can be fully obtained based on the runtime information of signals of flip-flops and combinational logic circuit structure of the target module. That is, all signals of the target module including signals of flip-flops and signals of combinational logic circuits can be probed. The obtained runtime information of all signals of the target module can be saved as a file for subsequential debugging of the target module.

Figure 4:
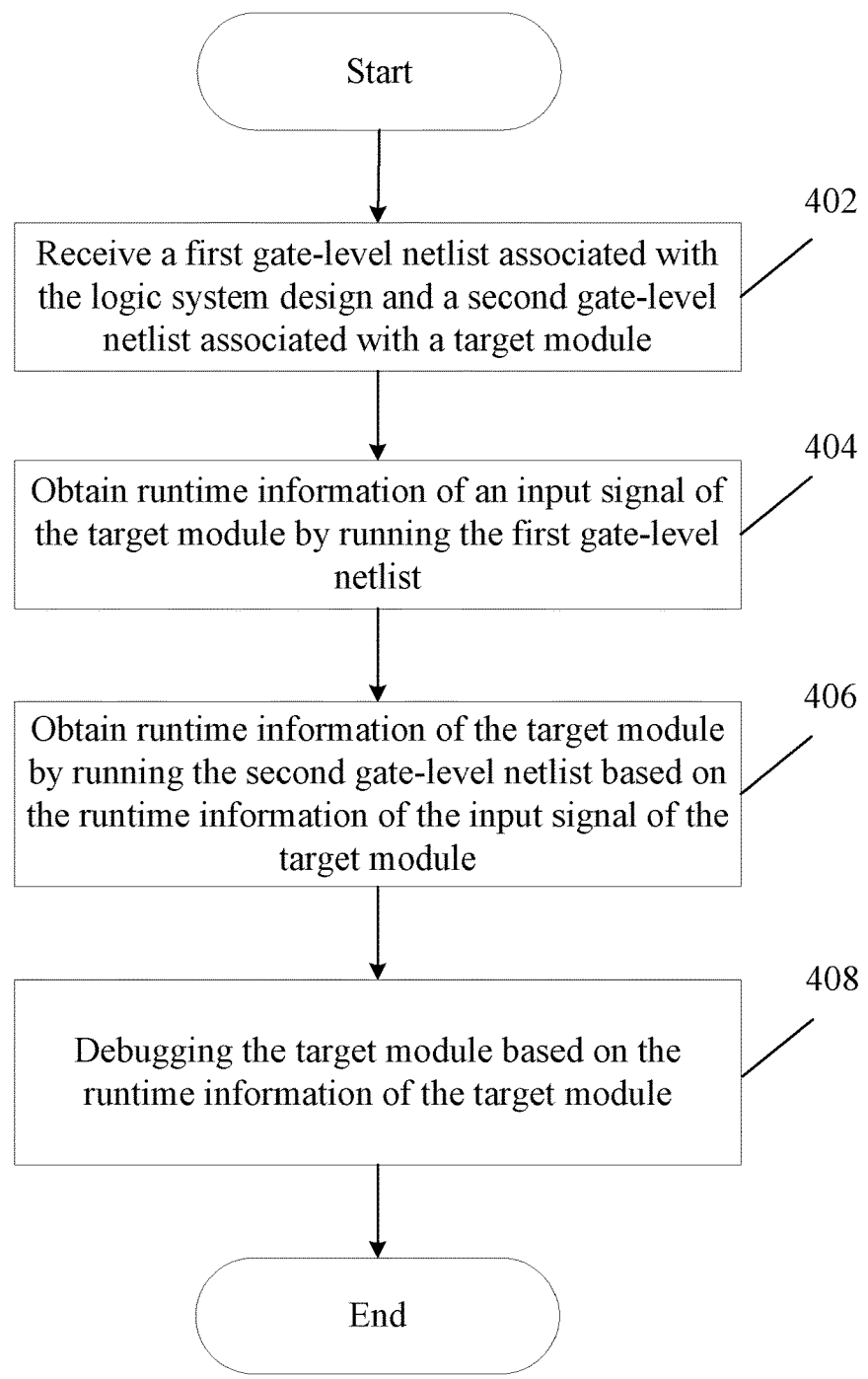
FIG. 4 is a schematic flowchart of an exemplary method for debugging a logic system design, according to embodiments of the present disclosure.

FIG. 4 is a schematic flowchart of an exemplary method 400 for debugging a logic system design, according to the embodiments of the present disclosure. The logic system design includes a target module to be debugged, and the target module includes a plurality of sequential logic circuits and a plurality of combinational logic circuits. Method 400 can be implemented by, for example, emulator 102 of FIG. 1. Method 400 can include the following steps.

At step 402, a first gate-level netlist (e.g., first gate-level netlist 202 of FIG. 2A) associated with the logic system design and a second gate-level netlist (e.g., second gate-level netlist 204 of FIG. 2A) associated with the target module can be received. The first gate-level netlist and the second gate-level netlist are generated based on the description (e.g., description 1042 of FIG. 2A) of the logic system design. As shown in FIG. 2A, first gate-level netlist 202 and second gate-level netlist 204 are generated based on the description (e.g., description 1042 of the logic system design of FIG. 2A) of the logic system design.

In some embodiments, the target module to be debugged is determined by a request (e.g., request 1044 of FIG. 2A) from a user.

At step 404, the runtime information of input signals of the target module can be obtained by running the first gate-level netlist. For example, as shown in FIG. 2B, an emulator 102 can load first gate-level netlist 202 into an FPGA for running, and therefore, circuits (e.g., emulation circuit 210 of FIG. 2B) can be emulated in the FPGA. Because first gate-level netlist 202 includes the entire description (e.g., netlist 2024 of the logic system design of FIG. 2A) of gate-level circuit of the logic system design, the complete runtime information of the logic system design, including the runtime information of the target module, can be generated by running emulation circuit 210 corresponding to the first gate-level netlist.

In some embodiments, the first gate-level netlist includes the description (e.g., netlist 2022 of first signal probing circuit of FIG. 2A) of gate-level circuit of the first signal probing circuit for probing the runtime information of input signals of the target module. Obtaining the runtime information of the input signals of the target module by running the first gate-level netlist can further include: by the first signal probing circuit (e.g., first signal probing circuit 216 as shown in FIG. 2B), probing the runtime information of the input signals of the target module while the first gate-level netlist is being run.

At step 406, based on the runtime information of the input signals of the target module, the runtime information of the target module can be obtained by running the second gate-level netlist. As shown in FIG. 2C, because second gate-level netlist 204 includes the description (e.g., target module netlist 2044 of FIG. 2A) of gate-level circuit of the target module, the runtime information of the target module 214 can be generated by running emulation circuit 220 corresponding to the second gate-level netlist.

In some embodiments, obtaining the runtime information of the target module by running the second gate-level netlist can further include: based on the runtime information of input signals of the target module, running the second gate-level netlist, so as to obtain the runtime information of the output signals of the plurality of sequential logic circuits (e.g., sequential logic circuits 2146 of FIG. 2C) of the target module; and generating the runtime information of the target module at least based on the input signals of the target module and the runtime information of the output signals of the plurality of sequential logic circuits (e.g., sequential logic circuits 2146 of FIG. 2C) of the target module.

In some embodiments, the second gate-level netlist includes the description (e.g., netlist 2042 of second signal probing circuit as shown in FIG. 2A) of gate-level circuit of a second signal probing circuit for probing the runtime information of output signals of the plurality of sequential logic circuits of the target module. Therefore, based on the runtime information of the input signals of the target module, obtaining the runtime information of the output signals of the plurality of sequential logic circuits of the target module by running the second gate-level netlist can further include: probing the runtime information of the output signals of the plurality of sequential logic circuits (sequential logic circuit 2146 of FIG. 2C) of the target module by the second signal probing circuit (e.g., second signal probing circuit 222 of FIG. 2C) while the second gate-level netlist is being run.

In some embodiments, generating the runtime information of the target module can further include: according to the runtime information of the stimulus signals of the plurality of combinational logic circuits (e.g., combinational logic circuit 2144 of FIG. 2C) of the target module, generating the runtime information of the output signals of the plurality of combinational logic circuits of the target module based on the circuit structure of the target module. The stimulus signals at least include input signals of the target module and output signals of the plurality of sequential logic circuits (e.g., sequential logic circuits 2146 of FIG. 2C) of the target module. In some embodiments, the target module can further include a memory (e.g., memory 1024 of FIG. 1), and stimulus signals can further include output signals of the memory.

In some embodiments, the circuit structure of the target module can be determined according to the description of the logic system design. For example, the gate-level netlist generated by the description of the logic system design can include the circuit structure of gate-level circuit within the logic system design, and therefore, the gate-level netlist can include the circuit structure of the target module. According to the stimulus signals and the circuit structure of the target module, the runtime information of the output signals of the plurality of combinational logic circuits of the target module can be similarly calculated as described with reference to FIGS. 3A-B.

In some embodiments, the plurality of sequential logic circuits of target module include at least one of the flip-flops (e.g., sequential logic circuits 2146 of FIG. 2C), registers, counters, or sequential pulse generators.

In some embodiments, method 400 can further include: based on the runtime information of the output signals of the plurality of sequential logic circuits of the target module, the target module can be self-verified at least according to the input signals of the target module and the runtime information of the output signals of the plurality of sequential logic circuits of the target module. For example, as shown in FIG. 3B, the target model can be self-verified by the calculated output signals of FF4 and the probed output signals of FF4.

At step 408, the target module can be debugged based on the runtime information of the target module. For example, erroneous signals can be identified according to the runtime information of the target module, and the design of the target model can be modified according to the erroneous signals.

The specific embodiments of the present disclosure are described above. Other embodiments are within the scope of the claims. In some circumstances, the actions or steps in the claims can execute in a different order from the embodiments and still achieve the desired result. In addition, the process depicted in the drawings does not require the specific order or sequential order in order to achieve the desired results. In some embodiments, multitasking and parallel processing are also possible or can be advantageous.

As shown in FIG. 1, emulator 102 can include: interface unit 1022 for connecting with a host 104; a memory 1024 for storing a set of instructions; at least one processor, configured to execute the set of instructions to perform any one of the aforementioned embodiments or the permutation and combination of embodiments for the method to debug the logic system design.

In some embodiments, emulator 102 can be configured to send the runtime information of input signals of the target module and the runtime information of output signals of the plurality of sequential logic circuits of the target module to host 104, so that host 104 can generate the runtime information of the target module according to the runtime information of the input signals of the target module and the runtime information of the output signals of the plurality of sequential logic circuits of the target module. For example, emulator 102 can temporarily store the runtime information of the input signals of the target module and the runtime information of the output signals of the plurality of sequential logic circuits of the target module into memory 1024 (as shown in FIG. 1) in emulator 102, and send the runtime information of the input signals of the target module and the runtime information of the output signals of the plurality of sequential logic circuits of the target module to host 104 according to instructions (e.g., instructions from a user) for further calculations.

For convenience, the device is divided into various modules by functions for description. The functions of various modules can be certainly implemented in one or more pieces of software and/or hardware in the present disclosure.

The apparatus of the embodiments above are used to implement the corresponding method in the foregoing embodiments, and have the beneficial effects of the corresponding method or embodiments, which will not be repeated here.

The computer-readable medium in the present disclosure includes volatile, non-volatile, removable, or non-removable medium, and information storage can be realized by any method or technology. The information can be computer readable instructions, data structures, program modules or other data. The storage medium, for example, includes, but is not limited to, phase change memory (PRAM), static random access memory (SRAM), dynamic random access memory (DRAM), other types of random access memory (RAM), read-only memory (ROM), electrically erasable programmable read-only memory (EEPROM), flash memory or other memory technology, CD-ROM, digital versatile disc (DVD) or other optical storage, Magnetic cassettes, magnetic tape magnetic disk storage or other magnetic storage devices or any other non-transitory media can be used to store information that can be accessed by computing devices.

It can be appreciated by those ordinary skilled in the art that, any embodiments discussed above are merely exemplary and do not indicate that the scope of the present disclosure is limited by these embodiments; under the idea of the present disclosure, embodiments or the technical features in different embodiments above can be combined, the steps can be implemented in any order, and there can be different changes in different aspects of the present disclosure as described above, and for brevity, they are not provided in details.

In addition, to simplify the description and discussion, the well-known power source/ground connected to integrated circuit (IC) chips and other components may or may not be shown in the provided drawings. In addition, the devices can be shown in the form of diagrams to avoid making the present disclosure difficult to understand, and this also takes into consideration the following facts that the details of the implementation of these devices in diagrams are highly dependent on the platform which will implement the present disclosure (that is, the details are understood by those ordinary skilled in the art). Under the circumstance that details (for example, circuits) are described to describe exemplary embodiments of the present disclosure, it is obvious to those skilled in the art that it can be possible to implement the present disclosure without these specific details or with these specific details being changed.

Although the present disclosure has been described in conjunction with specific embodiments of the present disclosure, the plurality of substitutions, modifications, and variations of these embodiments can be obvious to those skilled in the art according to the foregoing description. For example, other memory architectures (e.g., dynamic RAM (DRAM)) can be used in the discussed embodiments.

The present disclosure is intended to cover all such substitutions, modifications and variations that fall within the broad scope of the appended claims. Therefore, any omission, modification, equivalent replacement, improvement, and the like within the spirit and principle of the present disclosure should be included in the protection scope of the present disclosure.

What is claimed is:

1. A method for debugging a logic system design, wherein the logic system design comprises a target module to be debugged, the method comprising:
    receiving a first gate-level netlist associated with the logic system design and a second gate-level netlist associated with the target module, wherein the first gate-level netlist and the second gate-level netlist are generated based on a description of the logic system design;
    obtaining runtime information of an input signal of the target module by running the first gate-level netlist; and
    obtaining runtime information of the target module by running the second gate-level netlist based on the runtime information of the input signal of the target module.

2. The method of claim 1, wherein the first gate-level netlist comprises a description of gate-level circuits of a signal probing circuit for probing the runtime information of the input signal of the target module, and obtaining the runtime information of the input signal of the target module by running the first gate-level netlist further comprises:
    probing the runtime information of the input signal of the target module using the signal probing circuit while the first gate-level netlist is being run.

3. The method of claim 1, wherein the target module comprises a plurality of sequential logic circuits and a plurality of combinational logic circuits, and obtaining the runtime information of the target module by running the second gate-level netlist further comprises:
    obtaining runtime information of output signals of the plurality of sequential logic circuits of the target module by running the second gate-level netlist based on the runtime information of the input signal of the target module; and
    generating the runtime information of the target module at least according to the runtime information of the input signal of the target module and the runtime information of the output signals of the plurality of sequential logic circuits of the target module.

4. The method of claim 3, wherein the second gate-level netlist comprises a description of gate-level circuits of a signal probing circuit for probing the runtime information of the output signals of the plurality of sequential logic circuits of the target module, and obtaining the runtime information of the output signals of the plurality of sequential logic circuits of the target module by running the second gate-level netlist based on the runtime information of the input signal of the target module further comprises:
    probing the runtime information of the output signals of the plurality of sequential logic circuits of the target module using the signal probing circuit while the second gate-level netlist is being run.

5. The method of claim 3, wherein generating the runtime information of the target module further comprises:
    according to runtime information of stimulus signals of the plurality of combination logic circuits of the target module, generating runtime information of output signals of the plurality of combinational logic circuits of the target module based on circuit structure of the target module, wherein the stimulus signals at least comprise the input signal of the target module and the output signals of the plurality of sequential logic circuits of the target module.

6. The method of claim 5, wherein the circuit structure of the target module is determined according to the description of the logic system design.

7. The method of claim 5, wherein the target module further comprises a memory, and the stimulus signals further comprise an output signal of the memory.

8. The method of claim 3, wherein the plurality of sequential logic circuits of the target module comprise at least one of flip-flops, registers, counters, or sequential pulse generators.

9. The method of claim 1, wherein the target module is determined according to a request from a user.

10. An emulator to debug a logic system design, wherein the logic system design comprises a target module to be debugged, the emulator comprising:
    an interface unit configured to be connected with a host;
    a memory storing a set of instructions; and
    at least one processor configured to execute the set of instructions to:
        receive a first gate-level netlist associated with the logic system design and a second gate-level netlist associated with the target module, wherein the first gate-level netlist and the second gate-level netlist are generated based on a description of the logic system design;
        obtain runtime information of an input signal of the target module by running the first gate-level netlist; and
        obtain runtime information of the target module by running the second gate-level netlist based on the runtime information of the input signal of the target module.

11. The emulator of claim 10, wherein the at least one processor is further configured to execute the set of instructions to send the runtime information of the input signal of the target module and runtime information of output signals of a plurality of sequential logic circuits of the target module to the host, so that the host generates the runtime information of the target module according to the runtime information of the input signal of the target module and the runtime information of the output signals of the plurality of sequential logic circuits of the target module.

12. The emulator of claim 10, wherein the first gate-level netlist comprises a description of gate-level circuits of a signal probing circuit for probing the runtime information of the input signal of the target module, and the at least one processor is further configured to execute the set of instructions to obtain the runtime information of the input signal of the target module by:
    probing the runtime information of the input signal of the target module using the signal probing circuit while the first gate-level netlist is being run.

13. The emulator of claim 10, wherein the target module comprises a plurality of sequential logic circuits and a plurality of combinational logic circuits, and the at least one processor is further configured to execute the set of instructions to obtain the runtime information of the target module by:
    obtaining runtime information of output signals of the plurality of sequential logic circuits of the target module by running the second gate-level netlist based on the runtime information of the input signal of the target module; and
    generating the runtime information of the target module at least according to the runtime information of the input signal of the target module and the runtime information of the output signals of the plurality of sequential logic circuits of the target module.

14. The emulator of claim 13, wherein the second gate-level netlist comprises a description of gate-level circuits of a signal probing circuit for probing the runtime information of the output signals of the plurality of sequential logic circuits of the target module, and the at least one processor is further configured to execute the set of instructions to obtain the runtime information of the output signals of the plurality of sequential logic circuits of the target module by:
    probing the runtime information of the output signals of the plurality of sequential logic circuits of the target module using the signal probing circuit while the second gate-level netlist is being run.

15. The emulator of claim 13, wherein the at least one processor is further configured to execute the set of instructions to generate the runtime information of the target module by:
    according to runtime information of stimulus signals of the plurality of combination logic circuits of the target module, generating runtime information of output signals of the plurality of combinational logic circuits of the target module based on circuit structure of the target module, wherein the stimulus signals at least comprise the input signal of the target module and the output signals of the plurality of sequential logic circuits of the target module.

16. The emulator of claim 15, wherein the circuit structure of the target module is determined according to the description of the logic system design.

17. The emulator of claim 15, wherein the target module further comprises a target memory, and the stimulus signals further comprise an output signal of the target memory.

18. The emulator of claim 13, wherein the plurality of sequential logic circuits of the target module comprise at least one of flip-flops, registers, counters, or sequential pulse generators.

19. The emulator of claim 10, wherein the target module is determined according to a request from a user.

20. A non-transitory computer-readable storage medium storing a set of instructions that, when executed by an electronic device, cause the electronic device to:
    receive a first gate-level netlist associated with a logic system design and a second gate-level netlist associated with a target module of the logic system design, wherein the first gate-level netlist and the second gate-level netlist are generated based on a description of the logic system design;
obtain runtime information of an input signal of the target module by running the first gate-level netlist; and
obtain runtime information of the target module by running the second gate-level netlist based on the runtime information of the input signal of the target module.

* * * * *